(12) United States Patent
Cornelissen et al.

(10) Patent No.: US 10,330,266 B2
(45) Date of Patent: Jun. 25, 2019

(54) LED WITH THERMO-RESPONSIVE BLACK-BODY LINE DIMMING

(71) Applicant: SIGNIFY HOLDING B.V., Eindhoven (NL)

(72) Inventors: Hugo Johan Cornelissen, Eindhoven (NL); Jianghong Yu, Eindhoven (NL); Giovanni Cennini, Eindhoven (NL); Dirk Jan Broer, Eindhoven (NL); Kamlesh Kumar, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/545,188

(22) PCT Filed: Jan. 12, 2016

(86) PCT No.: PCT/EP2016/050469
§ 371 (c)(1),
(2) Date: Jul. 20, 2017

(87) PCT Pub. No.: WO2016/116327
PCT Pub. Date: Jul. 28, 2016

(65) Prior Publication Data
US 2018/0010740 A1 Jan. 11, 2018

(30) Foreign Application Priority Data
Jan. 23, 2015 (EP) .................................. 15152250

(51) Int. Cl.
*H01L 33/50* (2010.01)
*C08G 77/388* (2006.01)
(Continued)

(52) U.S. Cl.
CPC ................ *F21K 9/65* (2016.08); *C08G 77/38* (2013.01); *C08G 77/388* (2013.01); *C09K 11/06* (2013.01);
(Continued)

(58) Field of Classification Search
CPC ......... F21K 9/65; H01L 33/504; H01L 33/56; H01L 33/54; H01L 33/507
See application file for complete search history.

(56) References Cited

U.S. PATENT DOCUMENTS

| 2011/0176076 A1 | 7/2011 | Van Bommel et al. |
| 2012/0018754 A1 | 1/2012 | Lowes |

FOREIGN PATENT DOCUMENTS

| JP | 2010027586 A | 2/2010 |
| WO | WO2012035171 A2 | 4/2010 |

OTHER PUBLICATIONS

R.G. Saxton, "E-208 and E-406 of CRC Handbook of Chemistry and Physics 69th edition", pp. 1088-1989.

*Primary Examiner* — Joseph L Williams
(74) *Attorney, Agent, or Firm* — Akarsh P. Belagodu

(57) ABSTRACT

The invention provides a lighting device (10) comprising a light source (100) configured to generate light source light (101) and a light converter element (200), wherein the light converter element (200) comprises a light transmissive matrix (205), wherein the light transmissive matrix (205) comprises: (i) a first luminescent material (210) configured to convert at least part of one or more of (a) the light source light (101) and (b) optionally a second luminescent material light (221) from an optional second luminescent material (220) into a first luminescent material light (211); and (ii) a thermo-responsive liquid crystalline compound (250); wherein the light transmissive matrix (205) is configured in thermal contact with the light source (100), and wherein the lighting device (10) is further configured to provide lighting
(Continued)

device light (11) comprising said light source light (101), said first luminescent material light (210) and optionally said second luminescent material light (221), and wherein said light converter element is arranged for changing one or more of the color and color temperature of the lighting device light with the electrical power provided to the light source.

20 Claims, 6 Drawing Sheets

(51) Int. Cl.

| | |
|---|---|
| *H01L 33/56* | (2010.01) |
| *H01L 33/54* | (2010.01) |
| *F21K 9/65* | (2016.01) |
| *C09K 11/06* | (2006.01) |
| *C09K 11/08* | (2006.01) |
| *C09K 19/40* | (2006.01) |
| *F21K 9/64* | (2016.01) |
| *C08G 77/38* | (2006.01) |
| *F21Y 115/10* | (2016.01) |
| *C08G 77/00* | (2006.01) |
| *C09K 19/12* | (2006.01) |
| *C09K 19/20* | (2006.01) |
| *H01L 25/075* | (2006.01) |

(52) U.S. Cl.
CPC ............ *C09K 11/08* (2013.01); *C09K 19/406* (2013.01); *C09K 19/408* (2013.01); *F21K 9/64* (2016.08); *H01L 33/501* (2013.01); *H01L 33/504* (2013.01); *H01L 33/505* (2013.01); *H01L 33/507* (2013.01); *H01L 33/54* (2013.01); *H01L 33/56* (2013.01); *C08G 77/80* (2013.01); *C08G 2250/00* (2013.01); *C09K 2019/122* (2013.01); *C09K 2019/2035* (2013.01); *F21Y 2115/10* (2016.08); *H01L 25/0753* (2013.01); *H01L 2933/005* (2013.01); *H01L 2933/0041* (2013.01)

| | R=—(CH$_2$)$_k$—O—⟨⟩—⟨⟩—CN  LC1 | R=—(CH$_2$)$_k$—⟨⟩—C(=O)O—⟨⟩—O—  LC2 | R=—(CH$_2$)$_k$—O—⟨⟩—C(=O)O—⟨⟩—O—  LC3 |
|---|---|---|---|
| POSS cage with R groups  S$_1$ | S 160 I | S 83 N 93 I | S 94 I |
| Linear siloxane m, n  S$_2$ | S 94 I | S 22 N 30 I | S 56 I |
| Linear siloxane m≈17; n≈9  S$_3$ | S 122 I | S 40 N 63 I | S 105 I |

FIG. 3C

LED WITH THERMO-RESPONSIVE BLACK-BODY LINE DIMMING

CROSS-REFERENCE TO PRIOR APPLICATIONS

This application is the U.S. National Phase application under 35 U.S.C. § 371 of International Application No. PCT/EP2016/050469, filed on Jan. 12, 2016, which claims the benefit of European Patent Application No. 15152250.5, filed on Jan. 23, 2015. These applications are hereby incorporated by reference herein.

FIELD OF THE INVENTION

The invention relates to a lighting device comprising a light source and a luminescent material. The invention also relates to a method for customizing a(n existing) lighting device.

BACKGROUND OF THE INVENTION

The use of liquid crystal based materials in lighting applications is known in the art. WO2010035171, for instance, describes a lighting device comprising a light source arranged to generate light source light, an optional luminescent material, and a thermally variable reflecting element. The optional luminescent material is arranged downstream of the light source and is arranged to convert at least part of the light source light into luminescent material light. One or more of the light source and the optional luminescent material generate heat when the light source generates light source light. The thermally variable reflecting element is arranged downstream of the light source and the optional luminescent material. The thermally variable reflecting element has a first state wherein it is substantially reflecting and a second state wherein it is substantially transparent; heat induces a chance from the first state to the second state. The thermally variable reflecting element is arranged to transmit at least part of one or more selected from the group consisting of the light source light and optional luminescent material light when being in the second state. The lighting device is arranged to transport heat generated by one or more of the light source and the optional luminescent material to the thermally variable reflecting element.

JP2010027586 describes a liquid crystal dimming shutter or a high polymer distributed liquid crystal dimming shutter that is arranged in front of the light emitting diode. Preferably, illumination of the diffused light, the dimmed light and also a desired light color is provided by adding or dispersing a predetermined phosphor or a pigment in the liquid crystal dimming shutter. The shutter comprises an electrically activated liquid crystal material.

US2011/0176076 describes a lighting device comprising a light source arranged to generate light source light, an optional luminescent material and a thermally variable reflecting element. The optional luminescent material is arranged downstream of the light source and is arranged to convert at least part of the light source light into luminescent material light. One or more of the light source and the optional luminescent material generate heat when the light source generates light source light. The thermally variable reflecting element is arranged downstream of the light source and the optional luminescent material. The thermally variable reflecting element has a first state wherein it is substantially reflecting and a second state wherein it is substantially transparent; heat induces a chance from the first state to the second state. The thermally variable reflecting element is arranged to transmit at least part of one or more selected from the group consisting of the light source light and optional luminescent material light when being in the second state. The lighting device is arranged to transport heat generated by one or more of the light source and the optional luminescent material to the thermally variable reflecting element.

US2012/018754 describes a light emitter device, package, or lamp that comprises and light emitter and a light transmission control material to mask the appearance of at least the light emitter. In one embodiment, a light emitting diode (LED) based lamp is disclosed, comprising an LED light source. A phosphor is arranged remote to the light source such that light emitted from the light source passes through this phosphor and is converted by this phosphor. A light transmission control material is applied at least partially outside the LED light source and the phosphor to reversibly mask the appearance of the LED light source and the phosphor. The light transmission control material is less masking when the LED light source is active. A method for masking the appearance of inactive light emitters is also disclosed that comprising providing at least one light emitter. Each of the at least one light emitters is provided with a light transmission control material over the light emitters to reversibly mask the appearance of the light emitters while the light emitters are inactive. The light transmission control material is less masking when the LED light source is active.

SUMMARY OF THE INVENTION

Light emitting diodes (LEDs) are quickly replacing traditional incandescent light sources for general lighting applications due to their much higher energy efficiency and longer lifetime. LEDs in various shades of white have become widely available, characterized by the correlated color temperature (CCT). This is the temperature of a black body radiator that is perceived by the human eye to emit the same white light as the LEDs. The incandescent light bulb is such a black body radiator with a CCT of around 2700K. Commonly used LED values range from "cool white" with a CCT of 6500 K like day light, through "neutral white" with a CCT of 4000 K, down to the "warm white" CCT of 2700 K, like the incandescent bulb.

We are very much used to the fact that if a traditional incandescent light bulb is dimmed, the spectrum changes and becomes more reddish, i.e. the CCT decreases. This follows naturally from the fact that decreasing the power will lower the temperature of the incandescent wire and hence will affect the emitted black-body spectrum.

In contrast with the incandescent bulb, an LED does not change spectrum and hence does not decrease in color temperature when dimmed. This is perceived as unnatural in some applications and there is a need for LED illumination systems that follows the black body line when dimmed.

A very characteristic problem occurs when phosphor-converted white LEDs are embedded fully into a dielectric medium like glass or transparent polymer instead of operating in air. It is seen that the color temperature (CCT) increases significantly. This is caused by the enhanced extraction efficiency for blue light whereby less conversion to the yellow part of the spectrum occurs.

A known way to solve the above mentioned problem of the black-body-line dimming is to combine various LEDs with different spectra in one package or system and electronically set the resulting spectrum by controlling the individual LED driving currents. With low output power the spectrum should be more reddish, with high output power more bluish. This can be achieved by including some driving electronics. But also some optical measures have to be included to mix the light of the constituent LEDs angularly and spatially. Hence the present systems have the disadvantage of cost and complexity of electronics and optical components. Furthermore in such systems not all the installed LEDs will contribute to the light output in all settings. For instance, a red LED will be dimmed at high output levels because the spectrum should be bluish. Up or down scaling of these systems is also limited, e.g. a system might consist of 3 white LEDs and 1 red LED. Scaling to larger systems will have to be done by adding non-incrementally multiple (3+1) LEDs. This is a problem in spot light applications where usually space is limited.

Hence, it is an aspect of the invention to provide an alternative lighting device, which preferably further at least partly obviates one or more of above-described drawbacks. It is further an aspect of the invention to customize existing lighting devices in such a way, that they further at least partly obviate one or more of above-described drawbacks.

The present invention claims to overcome the problems of added cost, scalability, and complexity of electronic and optical components by creating a single LED that may substantially automatically follow the black body line when dimmed. It is herein described that the correlated color temperature of a dimmable light emitting diode assembly can be set to follow the black body line by introducing a thermo-responsive scattering material in the phosphor mixture that is excited by a blue or UV LED. This material increases the optical path length through the phosphor in a temperature-dependent way. At low driving power the path length is longer and hence more light is converted to longer wavelengths resulting in a more reddish, warmer spectrum. At high driving power the thermo-responsive material scatters less light and a more bluish, cooler spectrum is emitted. The advantage is that black-body line dimming can be achieved with one single LED, implying less complexity in electronics and/or in color mixing optics. An advantage of the present device is that this gives the manufacturer of the lighting system a simple way to achieve black-body-line dimming, without the need for extra driving electronics or color-mixing optics, though other optical effects may also be created with the invention.

Hence, in a first aspect the invention provides a lighting device (herein also indicated as "device") comprising a light source configured to generate light source light and a light converter element (herein also indicated as "light converter"; the light converter element can also be indicated as "light conversion element"), wherein the light converter element comprises a light transmissive matrix comprising (i) a first luminescent material configured to convert at least part of one or more of (a) the light source light and (b) optionally a second luminescent material light from an optional second luminescent material into a first luminescent material light, and (ii) a thermo-responsive liquid crystalline compound, wherein the light transmissive matrix is especially configured in thermal contact with the light source, and wherein the lighting device is further configured to provide lighting device light, comprising said light source light (or at least part of the visible part thereof), said first luminescent material light and optionally said second luminescent material light, especially downstream from said light transmissive matrix, especially wherein said light converter element is arranged for changing one or more of the color and color temperature of the lighting device light with the electrical power provided to the light source, even more especially wherein said light converter element is arranged for changing the color temperature of the lighting device light with the electrical power provided to the light source.

In yet a further aspect, the invention also provides a method for customizing a lighting device, such as an existing lighting device, configured to generate white lighting device light, wherein the lighting device comprises a light emitting surface, the method comprising providing a coating to said light emitting surface, wherein the coating comprises a light converter element, wherein the light converter element comprises a light transmissive matrix comprising (i) a first luminescent material configured to convert at least part of the lighting device light into first luminescent material light, and (ii) a thermo-responsive liquid crystalline compound, and wherein the coating is transmissive for at least part of said lighting device light, and wherein the lighting device light downstream from said coating further comprises at least part of said first luminescent material light.

The herein described lighting device may especially be used for providing lighting device light of which one or more of the color and color temperature changes with (the amount of) electrical power provided to the light source. Even more especially, such lighting device may be configured to provide white lighting device light, wherein the color temperature of the lighting device light increases with increasing electrical power and decreases with decreasing electrical power over at least part of an electrical power range. Hence, the present invention allows with a single device and without complex electronics, filters, optics, moving pieces etc., the tuning of the color and/or color temperature. Even more, the present invention allows a "natural" behavior of the lighting device in the sense that the color temperature may decrease when the intensity of the lighting device is also decreased (just as in the case of incandescent lamps). Further, it surprisingly appears to be possible to provide a lighting device providing white light of which the color point substantially follows the black body locus (BBL) as function of the applied power of the lighting device, at least over a part of the electrical power range (possible).

The lighting device as indicated above is especially a single package with one or more (LED) light sources. Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light. In a specific embodiment, the light source comprises a solid state LED light source (such as an LED or laser diode). The term "light source" may also relate to a plurality of (different) light sources, such as 2-20 (solid state) LED light sources. Hence, the term LED may also refer to a plurality of LEDs. Hence, in general the lighting device light will comprise at least part of the (visible) light source light. In yet another embodiment, the light source comprises a white light emitting LED.

The lighting device as described herein may be provided in several embodiments. For instance, in an embodiment the lighting device without the light transmissive matrix comprising the first luminescent material and the thermo-responsive liquid crystalline compound may (already) provide white light (see also above). The additional light transmissive matrix may be used for a tuning of the white light. In such embodiment (and variants thereof), the additional light transmissive matrix may especially include a red luminescent material (as first luminescent material), even more a red luminescent material that (also) absorbs part of the green and/or yellow light of the lighting device light. In this way, the lighting device light downstream from the light transmissive matrix may include a red component, which in specific embodiments relatively increases (relative e.g. to the blue and green emission, or the blue and yellow emission, or the blue and green and yellow emission) when decreasing the power of the lighting device (see also below). Hence, in this way existing lighting devices may be fine-tuned. For instance, a coating (see further also below) comprising the light transmissive matrix may be applied to such existing lighting device. Hereby, the existing lighting device which may have an emission spectrum that is substantially independent of the power of the lighting device may now become dependent upon the power of the lighting device. In yet another embodiment, the first luminescent material is substantially necessary to provide white light per se. This may especially be the case when the lighting device without the first luminescent material would provide blue and green light, making a red component necessary to provide white light, or when the lighting device would provide blue and green and yellow light, but in such a combination that a red component may also be necessary to provide white light.

Hence, the lighting device as described herein is especially configured to provide white light, especially with a variable color temperature, wherein the color temperature is dependent upon the provided electrical power to the lighting device. However, the lighting device may also be configured to provide colored light as the principle of the invention with the matrix comprising the first luminescent material and the thermo-responsive liquid crystalline compound may also be applied for colored light sources. Further, it is also possible with the invention not only to provide a lighting device of which the color temperature of the white light substantially follows the black body locus (BBL) but it is also possible to provide a lighting device that, is configured to provide dependent upon the power applied white light or colored light.

The light converter element described herein is especially a light transmissive light converter, and is especially transmissive for at least part of the light source light. Hence, when providing light source light to the light converter element, some of the light source light may be found downstream from the light converter element. When the light converter element is applied to an existing lighting device, then the light converter element is (also) especially a light transmissive light converter, and is especially transmissive for at least part of the lighting device light. Hence, when providing lighting device light to the light converter element, some of the lighting device light may be found downstream from the light converter element (but enriched with some first luminescent material light.

Likewise, the light transmissive matrix described herein is thus especially a light transmissive light converter, and is especially transmissive for at least part of the light source light. Hence, when providing light source light to the light transmissive matrix, some of the light source light may be found downstream from the light transmissive matrix. When the light transmissive matrix is applied to an existing lighting device, then the light transmissive matrix is (also) especially a light transmissive matrix, and is especially transmissive for at least part of the lighting device light. Hence, when providing lighting device light to the light transmissive matrix, some of the lighting device light may be found downstream from the light transmissive matrix (but enriched with some first luminescent material light. Note that the light converter element in an embodiment may comprise other elements, like e.g. one or more (optically active) layers in addition to the light transmissive matrix (or light transmissive matrices). However, in yet another embodiment the light converter element essentially consists of the light transmissive matrix (or light transmissive matrices).

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream". Especially, the material (of the light transmissive matrix/matrices, or of the (entire) light converter element) has a light transmission in the range of 50-100%, especially in the range of 70-100%, for light generated by the light source or lighting device and having a wavelength selected from the visible wavelength range. In this way, the light converter element is transmissive for visible light from the light source or lighting device. Herein, the term "visible light" especially relates to light having a wavelength selected from the range of 380-780 nm. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The light converter element comprises a matrix comprising the first luminescent material and the thermo-responsive liquid crystalline compound (the at least two functional materials). Such matrix may e.g. host the luminescent material as luminescent material particles, which may especially be the case when applying inorganic luminescent materials. However, the matrix may also host organic luminescent materials, which may e.g. be (molecularly) dispersed in the matrix material. The matrix thus comprises a matrix material comprising the (at least two) functional materials. The matrix material may especially comprise one or more materials selected from the group consisting of a transmissive organic material support or inorganic material support or hybrid material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). Especially, the matrix material comprises a silicone or polysiloxane, such as PDMS or polydiphenylsiloxane, or polysiloxane comprising methyl and phenyl groups, etc. The light converter element may especially be a body or layer. Such materials as identified above may provide a light transmissive matrix. Silicones are polymers that include repeating units of siloxane, frequently combined with carbon and/or hydrogen, such as methyl and/or phenyl group(s).

The matrix may especially include a mixture of the thermo-responsive liquid crystalline compound and the first luminescent material. For instance, the first luminescent materials may be embedded in a thermo-responsive liquid crystalline compound or both the first luminescent material and the thermo-responsive liquid crystalline compound are embedded in a host material, such as a polymeric material.

The term "light converter element" may also refer to a plurality of (different) light converter elements. These may be configured in physical contact to each other, but may also be configured at a non-zero distance from each other. In general, there will be at least one light converter element from which at a downstream side substantially all lighting device light may be perceived.

As indicated above, the luminescent material may be selected from an inorganic luminescent material and an organic luminescent material. The term "luminescent material" may also refer to a plurality of different luminescent materials. Likewise, the term "first luminescent material" or "second luminescent material" may refer to a plurality of (different) first luminescent materials or a plurality of (different) second luminescent materials, respectively.

Suitable luminescent materials include inorganic phosphors, such as (cerium) doped YAG, (cerium) doped LuAG, organic phosphors, organic fluorescent dyes, and quantum dots, etc., which are highly suitable for the purposes of embodiments of the present invention as set forth below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS).

The term "quantum dots" or "luminescent quantum dots" may also refer to a combination of different type of quantum dots, i.e. quantum dots that have different spectral properties. The QDs are herein also indicated as "wavelength converter nanoparticles". The term "quantum dots" especially refer to quantum dots that luminescence in one or more of the UV, visible and IR (upon excitation with suitable radiation, such as UV radiation).

The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170. Relevant examples of organic luminescent materials are e.g. perylenes (such as luminescent materials known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, India, and luminescent materials such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other luminescent materials, such as acid dyes, basic dyes, direct dyes and dispersion dyes may be used as long as they show a sufficiently high fluorescence quantum yield for the intended use. Organic materials of special interest that may be applied comprise for instance BASF Lumogen 850 for green luminescence, BASF Lumogen F083 or F170 for yellow luminescence, BASF Lumogen F 240 for orange luminescence, and BASF Lumogen F 300 or F305 for red luminescence.

The luminescent material may also be an inorganic phosphor. Examples of inorganic phosphor materials include, but are not limited to, cerium (Ce) doped YAG ($Y_3Al_5O_{12}$) or LuAG ($Lu_3Al_5O_{12}$). Ce doped YAG (shortly indicated as "YAG") emits yellowish light, whereas Ce doped LuAG (shortly indicated as LuAG) emits yellow-greenish light. Examples of other inorganic phosphors materials which emit red light may include, but are not limited to ECAS and BSSN; ECAS being $Ca_{1-x}AlSiN_3$:Eu$x$ wherein $0<x\leq1$, in other embodiments $0<x\leq0.2$; and BSSN being $Ba_{2-x-z}M_x Si_{5-y}Al_yN_{8-y}O_y$:Eu$_z$ wherein M represents Sr or Ca, $0\leq x\leq1$, $0<y\leq4$, and $0.0005\leq z\leq0.05$, and in embodiments $0\leq x\leq0.2$.

Some specific inorganic luminescent materials are discussed hereafter. Several options for green emitters are possible, including one or more of $(Ca,Sr,Ba)(Al,Ga,In)_2(O,S,Se)_4$:Eu$^{2+}$, a thiogallate, especially such luminescent material at least comprising Sr, Ga and S, such as $SrGa_2S_4$:Eu$^{2+}$. These types of luminescent materials may especially be narrow band green emitters. Optionally or alternatively, the inorganic luminescent material may comprise a $M_3A_5O_{12}$:Ce$^{3+}$ (garnet material), wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. Embodiments of garnets especially include $M_3A_5O_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with at least Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and $O$ may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}$: Ce, wherein x is equal to or larger than 0 and equal to or smaller than 1. The term ":Ce" or ":$Ce^{3+}$", indicates that part of the metal ions (i.e. in the garnets: part of the "M" ions) in the luminescent material is replaced by Ce. Especially a lutetium comprising garnet may provide the desired luminescence, especially when lutetium is at least 50% of M. Additionally or alternatively, the inorganic luminescent material may also comprise a luminescent material selected from the group consisting of divalent europium containing nitride luminescent material or a divalent europium containing oxonitride luminescent material, such as one or more materials selected from the group consisting of (Ba,Sr,Ca)S:Eu, (Mg,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":$Eu^{2+}$", indicates that part of the metal ions is replaced by Eu (in these examples by $Eu^2$). For instance, assuming 2% Eu in CaAlSiN$_3$:Eu, the correct formula could be $(Ca_{0.98}Eu_{0.02})$AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M i.e. one or more of Ba, Sr, and Ca). Likewise, the material (Ba,Sr,Ca)AlSiN$_3$:Eu can also be indicated as MAlSiN$_3$:Eu wherein M is one or more elements selected from the group consisting of barium (Ba)$_5$ strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the inorganic luminescent material comprises (Ca,Sr,Mg)AlSiN$_3$:Eu, preferably CaAlSiN$_3$:Eu. Further, in another embodiment, which may be combined with the former, the inorganic luminescent material comprises (Ca,Sr,Ba)$_2$Si$_5$N$_8$:Eu, preferably (Sr,Ba)$_2$Si$_5$N$_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

The inorganic luminescent material may also comprise one or more luminescent materials selected from the group consisting of a trivalent cerium containing garnet (see above) and a trivalent cerium containing oxonitride. The oxonitride materials are in the art often also indicated as oxonitride materials.

As indicated above, the lighting device at least comprises a first luminescent material, but may optionally also comprise a second luminescent material. At least one of the first luminescent material and the second luminescent material will be excitable by the light source. Hence, the first luminescent material or the second luminescent material or both the first luminescent material may be excitable by the light source.

When both the first luminescent material and the second luminescent material are available, then in some embodiments at least one of these may alternatively or additionally be excitable by the luminescence of the other luminescent material. For instance, there are red emitting phosphors available that absorb in the blue and green/yellow. It appears surprisingly that when the luminescent material in the matrix comprising also the thermo responsive liquid crystalline compound (in addition to the luminescent material), best results may be obtained when such luminescent material may be able to absorb at least part of the luminescence of the other luminescent material (see further also below).

The thermo-responsive liquid crystalline compound may especially be a material having liquid crystalline properties or having a group comprising such properties. One of the materials, which can be used for this purpose, is a polymer dispersed liquid crystal (PDLC). PDLC may e.g. be obtained when liquid crystal molecules are dispersed in an isotropic polymer. Hence, especially the matrix material (of the matrix comprising the thermo-responsive liquid crystalline compound) comprises an isotropic polymer (which isotropic polymer thus comprises said (first) luminescent material and said thermo-responsive liquid crystalline compound). Below the isotropic transition temperature of the liquid crystal the system is birefringent and molecules are randomly oriented and thus they induce light scattering. Above the clearing or transition temperature of the liquid crystal the material becomes isotropic and when the refractive index of the isotropic phase substantially matches the refractive index of the polymer above the isotropic transition temperature the system may become substantially transparent. It is also possible to use liquid crystal with high density of defect points For example caused by the presence of impurities such as polymer but it can also be particles. Such a system is highly scattering due to the presence of defects which cause domain formation. Upon heating the system above the isotropic transition temperature the system becomes transparent as the anisotropy of the system disappears. In the same way the cholesteric texture without macroscopic orientation can have so-called focal conic texture induced by defect such as particles and polymer in the liquid crystal showing a strong scattering of light. Here again upon heating the system above its isotropic transition the scattering disappears. Cholesteric liquid crystal can also be in a macroscopically orienting state showing reflection colors. Here again upon heating the system the reflection disappears and the system becomes transparent. Hence, for instance systems may be used that change from a smectic state at low temperature to an isotropic state at higher temperature. Hence, especially the thermo-responsive liquid crystalline compound is a material that is configure to induce the light transmissive matrix to change, as function from the temperature, from less transparent to more transparent, or vice versa (especially from less transparent (more scattering) at low temperatures to more transparent (less scattering) at high temperatures). Also combinations of different types of PDLC's may be applied.

It appears that in such instance the luminescence of the first luminescent material is promoted relative to the light of the light source (and/or relative to the luminescence of the second luminescent material)(or in embodiments relative to the lighting device light offered upstream to the light converter element) when decreasing the temperature. When for instance the first luminescent material would provide a red luminescence, the contribution of the red at a higher operation temperature, i.e. at higher electrical power may relatively be lower than at lower operation temperature, i.e. at a lower electrical power. This may be due to an enhanced scattering at lower temperatures (below the transition temperature of the thermo-responsive liquid crystalline compound). In an embodiment, the thermo-responsive liquid crystalline compound comprises one or more groups selected from the group consisting of (LC1, LC2 and LC3):

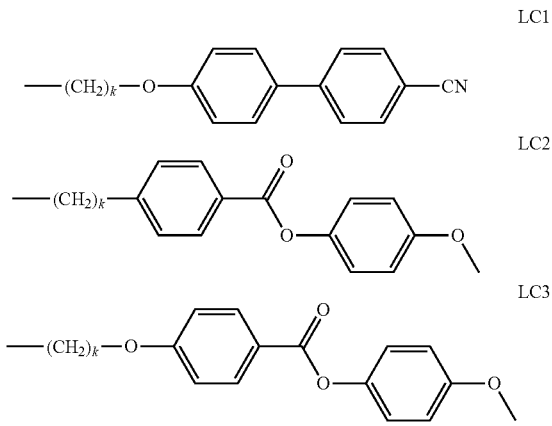

Here, k is especially 6. However, the invention is not limited to those groups. Further, also variants to those groups, such as with k is at least 2, such as k is at least 4, like at least 6, such as in the range of 4-20, such as 6-10 may also be possible.

Further, especially such liquid crystalline group may be a functional group grafted to a polymer of the matrix. Hence, for instance assuming a silicone matrix, especially the thermo-responsive liquid crystalline compound may comprise a silicone with a thermo-responsive liquid crystalline group. Hence, in this way a thermo-responsive liquid crystalline compound may be provided. Therefore, in a specific embodiment the light transmissive matrix comprises a silicone and the thermo-responsive liquid crystalline compound comprises a liquid crystal group functionalized silicone. Hence, in embodiments the light transmissive matrix may comprise a silicones, hosting silicones molecules grafted with thermo-responsive liquid crystalline groups (such as e.g. indicated above), i.e. the thermo-responsive liquid crystalline compound(s).

As indicated above the light transmissive matrix is in thermal contact with the light source. This may imply that the light transmissive matrix is in physical contact with the light source, such as in physical contact with an LED die. However, in other embodiments there may be no physical contact between the light transmissive matrix and the light source. Hence, in another embodiment the light transmissive matrix is configured without physical contact with said LED die. This may e.g. be the case in so-called "remote configurations", i.e. wherein the light transmissive matrix, or more especially the (first) luminescent material is configured at a non-zero distance from the light source (emitting surface, such as an LED die). For instance, the light source may comprise a (blue) LED with an LED die. However, in such instances wherein there is no physical contact between the light emissive surface of the light source, such as the LED die, and the light transmissive matrix, thermal energy of the light source may be transferred to the light converter element by thermal conduction and/or thermal radiation. The distance between light source and light transmissive matrix and the arrangement of the light source and light transmissive matrix may however be chosen such as to enable that heat of the light source reaches via one or more thermal conduction and/or thermal radiation. This may e.g. also imply that a heat sink may be smaller or may not be necessary. In an embodiment, the light transmissive matrix is in physical contact with the light source, especially with an LED die.

Hence, during operation of the lighting device, at least at maximum power, the light source will become hotter. Part of the thermal energy will be transferred to the light converter element. Hence, the light source and the light transmissive matrix are configured such that at maximum electrical power of the lighting device, the light transmissive matrix will have an increased temperature, such as above 40° C., especially above 60° C., such as at a temperature selected from the range of 50-150° C. At intermediate powers, the light transmissive matrix may also have lower temperatures. In a specific embodiment, the light transmissive matrix has at maximum operation (maximum output) of the lighting device a temperature $T_{max}$ (temperature of the matrix at maximum operation power of the lighting device), and especially the thermo-responsive liquid crystalline compound has a transition temperature selected from the range of 10-90%, such as 15-85% of $T_{max}$. In other words, the lighting device is configured to heat the light transmissive matrix to a temperature of $T_{max}$ at maximum operation of the lighting device. Here the term "maximum operation" may especially indicate the maximum operation (especially in Watt) as indicated for such lighting device. Further, this term especially indicates to operation in ambient at about 20-25° C., such as at about 20° C. Hence, especially the lighting device is configured to heat with thermal energy of the light source the light transmissive matrix. The temperature of the light transmissive matrix may thus scale with the power, as the temperature of the light source scales with the power. With increasing power, the temperature of the light source increases, and due to the thermal contact, the temperature of the light transmissive matrix increases. Especially, herein the thermo-responsive liquid is thus not electrically driven, but substantially only by heat. This allows a more simplified device than prior art devices, wherein the light source is electrically driven, and the transmissive matrix changes properties as function of the temperature of the light source.

As indicated above, the lighting device is configured to provide lighting device light. As also indicated above, this can be the lighting device light as such, or the lighting device light enriched with first luminescent material light. Both embodiments are indicated as "lighting device light". Further, when the lighting device comprises a second luminescent material, then the lighting device light may also include second luminescent material light. Note that term "lighting device light" does not indicate light of a fixed color and/or color point. Dependent upon the electrical power provided to the lighting device, the color and/or color temperature may change, which is a merit of the present invention.

Especially, the lighting device may be configured in the transmissive mode. Hence, the light converter element is configured downstream from the light source, and downstream from the light converter element at the other side of the light converter element, the light source light and the light converter light (i.e. at least the first luminescent material light) may be observed. Hence, the light source light travels through the light converter from one side to the other side, and part of the light source light escapes from the other side.

As indicated above, the light converter element (or the light transmissive matrix) may e.g. be a coating. Such coating may be applied on the lighting device or an element thereof. Hence, in an embodiment the lighting device comprises a support, and the light transmissive matrix is configured as coating on said support. For instance, the support can be the LED die. However, the support may also comprise a dome. The support may comprise a resin comprising a second luminescent material (see also below), which may thus be configured as second light transmissive matrix. However, the support may also include a ceramic material, such as a lumiramic. The support, when not being the light emitting surface, such as an LED die, may be configured remote from the light emitting surface, or may be in physical contact with the light emitting surface. The light converter may be configured upstream from the support (when the support is not the light emitting surface) and/or may be configured downstream from the support. A further advantage of the invention is that the light transmissive matrix may be easily applied as coating, for instance with a curable resin or other curable material (see further also below).

In an embodiment the light transmissive matrix comprises said first luminescent material and said second luminescent material, wherein said second luminescent material is configured to convert at least part one or more of (a) the light source light and (b) optionally the first luminescent material light into second luminescent material light, wherein the first luminescent material light has a first dominant wavelength different from a second dominant wavelength of the second luminescent material light. For instance, said first luminescent material may be a red emitting luminescent material and said second luminescent material may be a yellow and/or green emitting luminescent material, such as cerium containing YAG and/or LuAG, and the light source may especially be a blue light source, such as having a dominant wavelength in the range of 440-475 nm. Hence, in such embodiment the dominant wavelength of the first luminescent material is at a longer wavelength than the dominant wavelength of the second luminescent material. The phrase "a first dominant wavelength different from a second dominant wavelength" and similar phrases may especially indicate a wavelength difference of at least 20 nm, such as at least 40 nm, like at least 50 nm.

Above, the invention has amongst others been described in relation to a single light emissive matrix. However, the light converter element may also include a plurality of light emissive matrices. For instance, the light converter element may include a plurality of layers. However, as indicated above also a plurality of light converter elements may be applied. Hence, the light converter element may include a first light transmissive matrix and a second light transmissive matrix. In general, the embodiments described above in relation to the light transmissive matrix may also apply to one or more of the first transmissive matrix and the second light transmissive matrix.

Note that the presence of the first light transmissive matrix and the second light transmissive matrix does not exclude the availability of further light transmissive matrices. The term "second" is especially only used to indicate a different functionality. As can be deduced from the above, the term "first light transmissive matrix" or the term "second light transmissive matrix" may also refer to a plurality of (different) first light transmissive matrices or a plurality of (different) second light transmissive matrices. Further, also a single first light transmissive matrix may be combined with a plurality of second light transmissive matrices or a plurality of first light transmissive matrices may also be combined with a single second light transmissive matrix, etc.

In a specific embodiment, the lighting device comprises a first light transmissive matrix and a second light transmissive matrix, wherein one of the light transmissive matrices comprises said first luminescent material and said thermo-responsive liquid crystalline compound, and wherein the other of the light transmissive matrices comprises the second luminescent material (and optionally also a (different) thermo-responsive liquid crystalline compound), wherein the first luminescent material light has a first dominant wavelength different from a second dominant wavelength of the second luminescent material light. Hence, at least one of the light transmissive matrices comprises the thermo-responsive liquid crystalline compound, though in embodiments also both light transmissive matrices comprises the thermo-responsive liquid crystalline compound. Note that in such embodiments the thermo-responsive liquid crystalline compound in the different light transmissive matrices may also differ from each other. The matrix material of both light transmissive matrices may be identical, but may also differ. At least the luminescent materials in the light transmissive matrices may differ. This may optionally also include that the light transmissive matrices may differ in composition of luminescent materials. For instance, optionally both light transmissive matrices may comprise both the first luminescent material and the second luminescent material, but in different ratios. The light transmissive matrix comprising said thermo-responsive liquid crystalline compound is especially in thermal contact with the light source.

In a further specific embodiment, especially in combination with the above indicated embodiment with two light transmissive matrices, the first light transmissive matrix is configured downstream of said second light transmissive matrix, and said first light transmissive matrix comprises said thermo-responsive liquid crystalline compound. Hence, light downstream of the second light transmissive matrix may enter the first light transmissive matrix, and at least partly be transmitted through the first light transmissive matrix, to be perceived downstream (at the other side) of the first light transmissive matrix (but enriched with first luminescent material light). In yet a further specific embodiment, especially the light source may comprise a blue LED with an LED die, wherein the second light transmissive matrix is configured in physical contact with the LED die, and wherein the first light transmissive matrix is in physical contact with the first light transmissive matrix. In yet a further embodiment the first luminescent material is configured to convert at least part of the second luminescent material light into said first luminescent material light. It especially appears that such embodiment may provide the lighting device light to follow the BBL when increasing or decreasing the electrical power, at least over part of the electrical power range, especially in a way analogous to incandescent lamps.

The above embodiments may include said lighting device wherein especially the second luminescent material light has a second dominant wavelength in the green or yellow part of the visible spectrum, and wherein the first luminescent material light has a first dominant wavelength in the red part of the visible spectrum. However, other embodiments may also be possible.

As indicated above, the light converter element may be configured as e.g. a layer. For instance, a liquid mixture may be provided comprising suitable monomers to provide a polymeric host matrix, such as a silicone matrix, in combination with e.g. the first luminescent material (and optionally the second luminescent material(s) and the thermo-responsive liquid crystalline compound. The mixture may further comprise a polymerization catalyst or initiator. For instance, upon heating or irradiation with light, the liquid mixture may harden and form e.g. the first light transmissive matrix. Thereby the light converter element, especially the light transmissive matrix, may be provided. An advantage of such method with the liquid mixture is, as indicated above, the coating may be applied e.g. for customizing existing lighting devices. Hence, the invention may e.g. also be used in late-stage adaptation (customization) of lighting devices in a production process.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3a-3c depict some components of an embodiment of the light transmissive matrix (a,b) as well as some variant (c)

The schematic drawings are not necessarily on scale.

DETAILED DESCRIPTION OF THE EMBODIMENTS

As indicated above, a problem may occur when phosphor-converted white LEDs are embedded fully into a dielectric medium like glass or transparent polymer instead of operating in air. It is seen that the color temperature (CCT) increases significantly. This is caused by the enhanced extraction efficiency for blue light whereby less conversion to the yellow part of the spectrum occurs. The effect is illustrated in below table. In a phosphor-converted LED that is operated in air, a certain fraction of blue light is reflected back into the phosphor layer and converted in a second pass. An important reflection process is the total internal reflection that occurs at the interface between the LED and the air. When the LED is embedded in, for instance, silicone, a larger fraction of blue light is extracted immediately. Hence less wavelength conversion occurs and the color temperature is higher. In the below table, configuration of a blue LED with YAG on the LED die (in air), with YAG embedded in a different clear silicones, and with YAG embedded in a scattering silicone. The impact on the color temperature was measured and is shown in the table below: embedding in silicone the CCT goes up from 3100 K to about 4300 K, adding scattering it goes down to 2100 K. The LED current has no effect.

| Type | CCT (K) |
| --- | --- |
| clear silicones | 4000-4500 |
| in air | ~3100 |
| in scattering silicone | ~2100 |

In air, from the radiation 14% is in the blue part of the spectrum. When embedding the LEDs in clear silicone, this ratio goes up to 20%. Adding scattering particles the ratio decreases to 4%.

It is clear that the matrix and scattering may have a large impact on the correlated color temperature.

Figure 1:
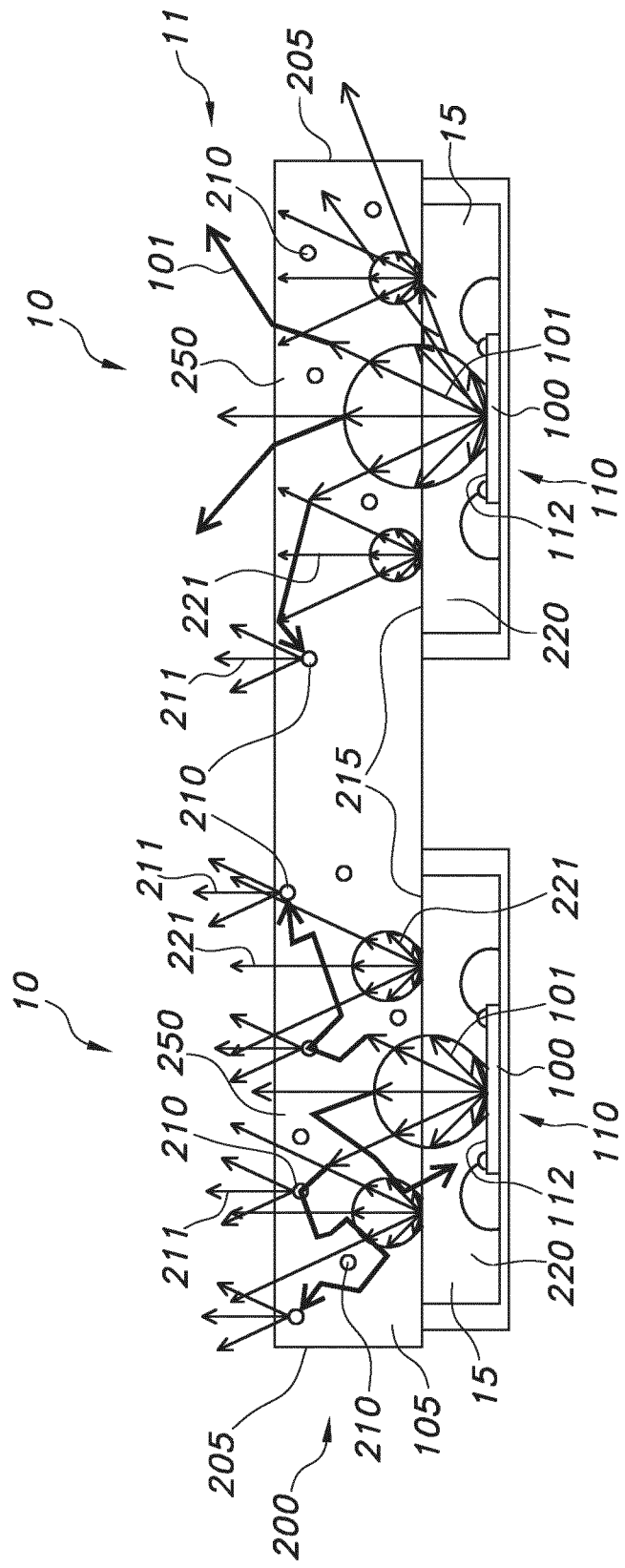
FIG. 1 schematically shows some aspects of operation of the thermo-responsive scattering material in the phosphor mix that is excited by a blue LED.

FIG. 1 schematically depicts some basics of operation of the thermo-responsive scattering material in the phosphor mix that is excited by a blue LED. On the left, a low current situation is depicted and on the right a high current situation is depicted. FIG. 1 shows an embodiment of the lighting device 10 comprising a light source 100 configured to generate light source light 101 and a light converter element 200. The light converter element 200 comprises a light transmissive matrix 205 comprising (i) a first luminescent material 210 configured to convert at least part of one or more of (a) the light source light 101 and (b) optionally a second luminescent material light 221 from an optional second luminescent material 220 into a first luminescent material light 211. Here indeed a second luminescent material 220 is available. For instance, the second luminescent 220 material may comprise YAG, which provides yellow light, and the first luminescent material 210 may comprise a red emitting luminescent material, which may be able to absorb also at least part of the yellow second luminescent material light 221 in addition to some of the blue light source light 101. Further, the light transmissive matrix 205 comprises (ii) a thermo-responsive liquid crystalline compound 250. The light transmissive matrix 205 is configured in thermal contact with the light source 100. However, as shown, there is—in this schematically depicted embodiment—no physical contact between the light source 100 and the light transmissive matrix 205. Further, as shown the lighting device 10 is configured to provide lighting device light 11 comprising said light source light 101, said first luminescent material light 210 and optionally said second luminescent material light 221. In this schematically depicted embodiment, the light source 100 comprises a blue LED 110 with an LED die 112. Further, the lighting device comprises a support 15, and the light transmissive matrix 205 is configured on. For instance, the light transmissive matrix 205 comprises a coating (or is a coating). Here, the support 15 may e.g. comprise a second light transmissive matrix comprising said second luminescent material 220, such as a silicone comprising YAG (see also above).

FIGS. 2a-2e schematically depict several embodiments and variants. In these Figures, amongst others embodiments of the lighting device 10 are depicted, wherein the lighting device comprises a first light transmissive matrix 1205 and a second light transmissive matrix 2205, wherein one of the light transmissive matrices 1205,2205 comprises said first luminescent material 210 and said thermo-responsive liquid crystalline compound 250, and wherein the other of the light transmissive matrices 2205,1205 comprises the second luminescent material 221, wherein the first luminescent material light 211 has a first dominant wavelength different from a second dominant wavelength of the second luminescent material light 221.

Figure 2A:
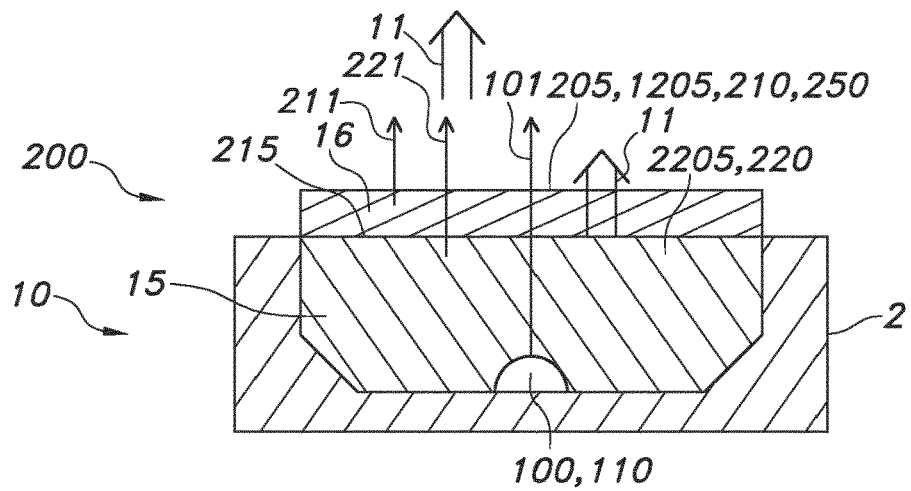
FIGS. 2a-2e depict some embodiments of the lighting device.

FIG. 2*a* schematically depicts an embodiment wherein the thermo-responsive phosphor mixture (i.e. the first light transmissive matrix 1205) is coated on top of a phosphor-converted white LED, converting an additional part of the generated blue and green light, depending on the temperature. It can for instance be a coating consisting of a Polymer-Dispersed Liquid Crystal (PDLC) material mixed with a red phosphor. Note that in FIG. 2*a*, e.g. the second light transmissive matrix 2205 comprises said second luminescent material 220, which may e.g. provide (already) white lighting device light 11. By providing the first light transmissive matrix 1205 with the thermo-responsive liquid crystalline compound 250 and the first luminescent material 210, the lighting device 10 and its lighting device light 11 may be customized. The lighting device light 11 will alter due to the presence of the first light transmissive matrix 1205 as at least a first luminescent material light 211 is added to the spectrum of the lighting device light 11, but optionally also part of the lighting device light may be absorbed by the first luminescent material to generate said first luminescent material light 211. Hence, lighting device light 11 is offered to the light converter element 200 at its upstream side, and downstream of the light converter element 200 lighting device light enriched with first luminescent material light 221, and optionally relatively diminished in one or more of light source light 101 and second luminescent material light 22,1 is provided. Here, the light converter element 200 is thus transmissive for at least part of the lighting device light and/or light source light. The term "transmissive" may e.g. relate to translucent or to transparent. In (one) state(s) the translucency may be higher and in another state (especially at a higher temperature), the transparency may be higher (than in the other, lower temperature state(s)).

Figure 2B:
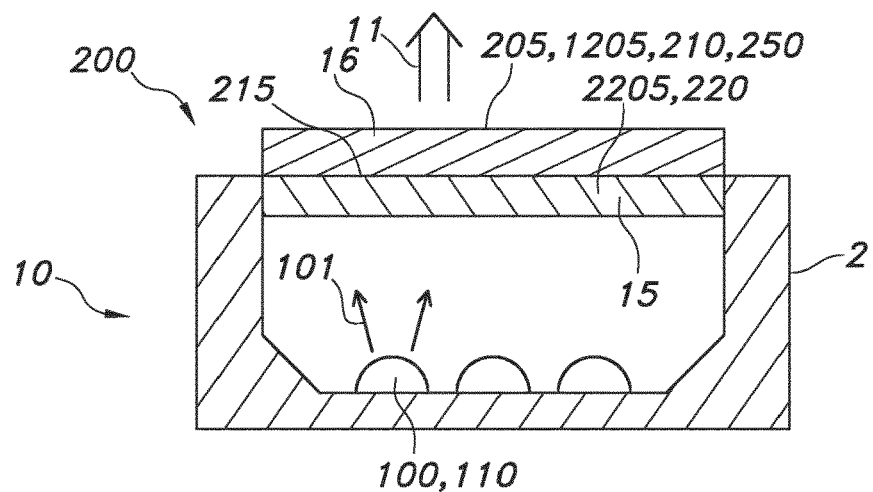

A further embodiment is schematically depicted in FIG. 2*b*. Here, a thermo-responsive phosphor mixture is added in the vicinity of a remote-phosphor plate that is excited by an array of blue LEDs. The thermo-responsive phosphor mixture is in thermal contact with the remote phosphor element, but not in contact with the light source(s). Via heat transfer, the light transmissive matrix 205, here the first light transmissive matrix 1205, can be heated. Hence, FIG. 2*b* schematically depicts an embodiment with blue LEDs in a mixing cavity capped with a remote phosphor plate and a thermo-responsive phosphor mixture (i.e. the first light transmissive matrix 1205).

Figure 2C:
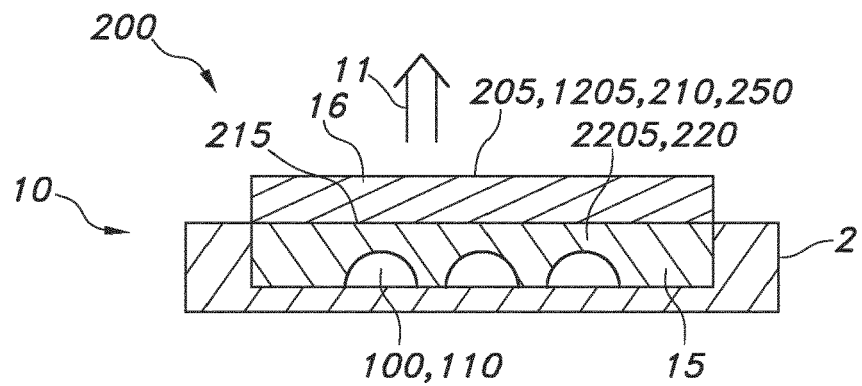

In a further embodiment, see FIG. 2*c* a Chip-on-Board configuration is sketched. Here the blue LEDs 110 (as example of the light source 100) are embedded in a phosphor layer (here the second light transmissive matrix 2205). The thermo-responsive phosphor mixture (here the first light transmissive matrix 1205) is coated over the phosphor layer. Hence, FIG. 2*c* schematically depicts an embodiment with a Chip-on-Board configuration with blue LEDs 110 on a board in a phosphor layer and capped by a thermo-responsive phosphor mixture.

Figure 2D:
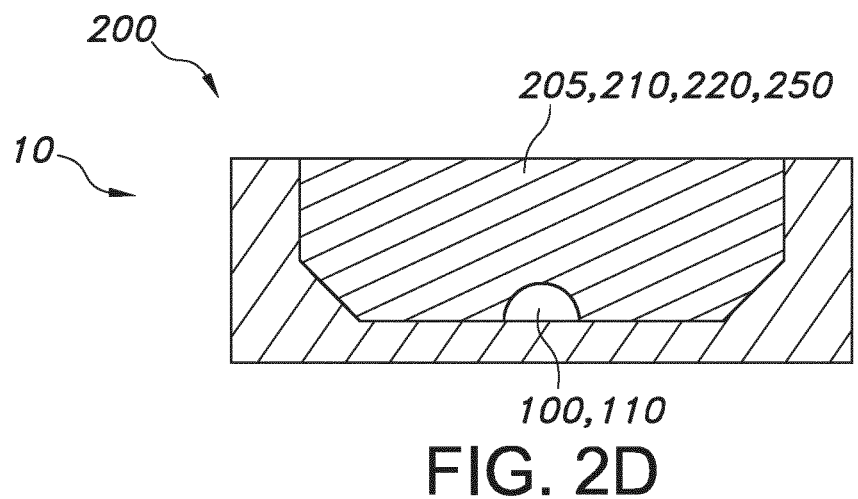

In the schematically depicted embodiment of FIG. 2*d* it is shown that the thermo-responsive phosphor mixture (here the light transmissive matrix 205) can also replace the usual phosphor mixture that covers the blue LED in the LED package. This has the advantage that it takes less steps in manufacturing. Hence, this FIG. 2*d* shows a blue LED 110 in a typical LED package filled with a thermo-responsive phosphor mixture comprising the first luminescent material 210, the second luminescent material 220 and the thermo-responsive liquid crystalline compound 250.

Figure 2E:
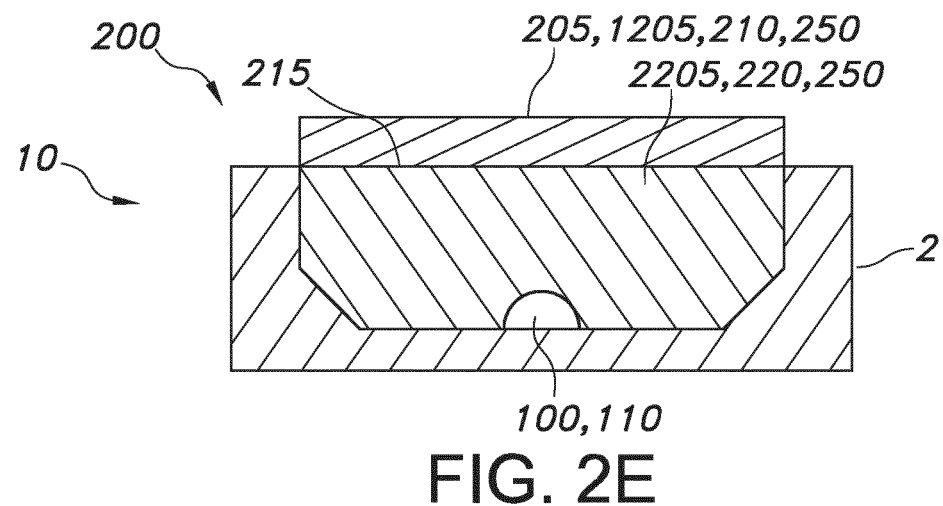

Further embodiments of thermo-responsive phosphor mixtures are in the realm of colored LEDs as shown in FIG. 2*e*. Thermo-responsive phosphor mixes can be applied with various color phosphors and with various thermal behaviors. Scattering may become stronger with increasing temperature leading to a longer optical path and more wavelength conversion. Or scattering may become weaker with increasing temperature, leading to a shorter path length and less wavelength conversion. The transition temperature of the various thermo-responsive materials may be different, for instance one responding to medium temperatures and a second one responding to high temperatures. In this way a system can be made that for instance changes color with temperature from blue (low T) to red (high T) or from blue (low T) to green (medium T) to red (high T) etc., depending on the ambient temperature or on the temperature induced by the LED current itself. FIG. 2*e* especially depicts a configuration of a thermo-responsive colored LED. A blue LED is inside a package and coated with two thermo-responsive phosphor mixtures, i.e. first light transmissive matrix 1205 and second light transmissive matrix 2205 (upstream from the first light transmissive matrix 1205). These mixes may have different color phosphors and different thermal behavior.

Applications may amongst others be in outdoor lighting, or lighting in a sauna, a refrigerator, a swimming pool, a faucet, a shower, in flat ironing, a dryer, a washing machine, an air conditioner, etc.

Figure 3A:
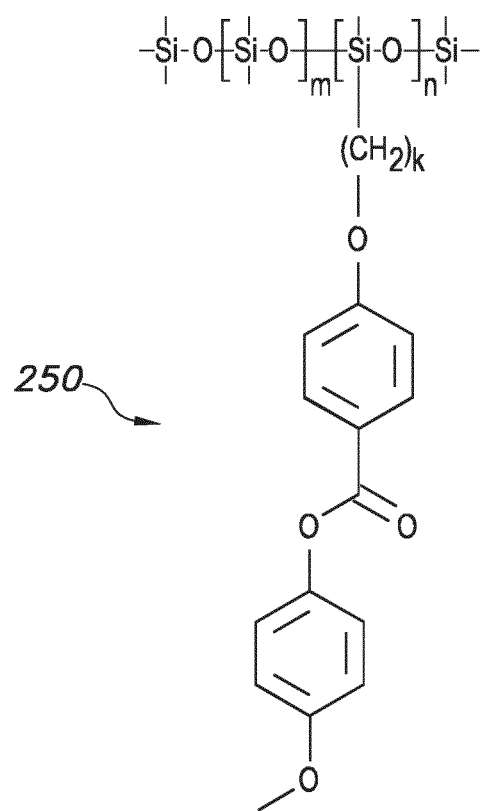
Figure 3B:
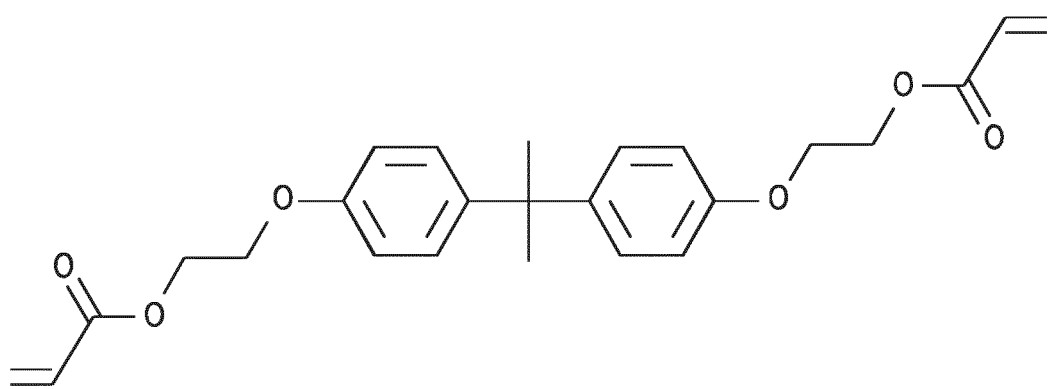

A library of silicone-based liquid crystalline compounds has been prepared and the thermo-optical properties of the compounds have been examined. The material presented here undergoes a transition from the scattering smectic liquid crystalline state to the transparent isotropic state at 50° C. which makes it an excellent candidate for the application on LEDs. FIG. 3*a* shows the silicone-based liquid crystalline component, i.e. an embodiment of the thermo-responsive liquid crystalline compound 250, and FIG. 3*b* shows the polymerizable matrix, here bisphenol A diacrylate (SR349 Matrix). With the aim of forming a stable and printable ink the silicone-based liquid crystal is mixed in a 1:1 mixture with bisphenol A diacrylate (see FIG. 3 (*b*)), a polymerizable matrix chosen for its refractive index that matches the mean refractive index of the silicone. When polymerized, the ink forms a scattering coating on glass slides and LEDs. Other transition temperatures can be achieved as indicated in FIG. 3*c*, which shows a table indicating the transition temperature between the various phases depending on the components, with S indicating smectic, N indicating nematic, and I indicating the isotropic phase. For instance A160I indicates that at a temperature of about 160° C. the material changes from a smectic phase (scattering) to an isotropic phase (less or no scattering). S1-S3 indicate three different (non-limiting) examples of silicones; LC1-LC3 indicate three different (non-limiting) examples of liquid crystalline functional groups that can be grafted to the S-S3 silicone chains. In FIGS. 3*a* and 3*c*, especially m and n may be about 6, though other values may also be possible. Further, the silicone may also be cyclic (see further below). In FIG. 3*a*-3*c*, the index "k" may also be 6, though other values may also be possible (see also above). Note that the side groups R in S1, S2 and S3 may all be the same, as shown in the table, but may in other embodiments also comprise two or more different groups. FIG. 3a is a combination of the silicone S2 and the LC3 group.

Further, the silicones S1-S3 in FIG. 3c are non-limiting examples. By way of example, Si includes in the ring 5 Si atoms. However, the ring may also include more than 5 Si atoms, such as e.g. up to 40 Si atoms. By way of example, m and n in S2 may both be about 6, though m and n may also differ from each other and/or differ from the value of about 6 (see also S3). Further, the silicone S3 has by way of example a value form of about 17 and a value for n of about 9. Also one or more of these values may differ (in other embodiments). In an embodiment, m and n may independently be selected from the group consisting of 2-25, such as 4-20, like 4-10.

Figure 4A:
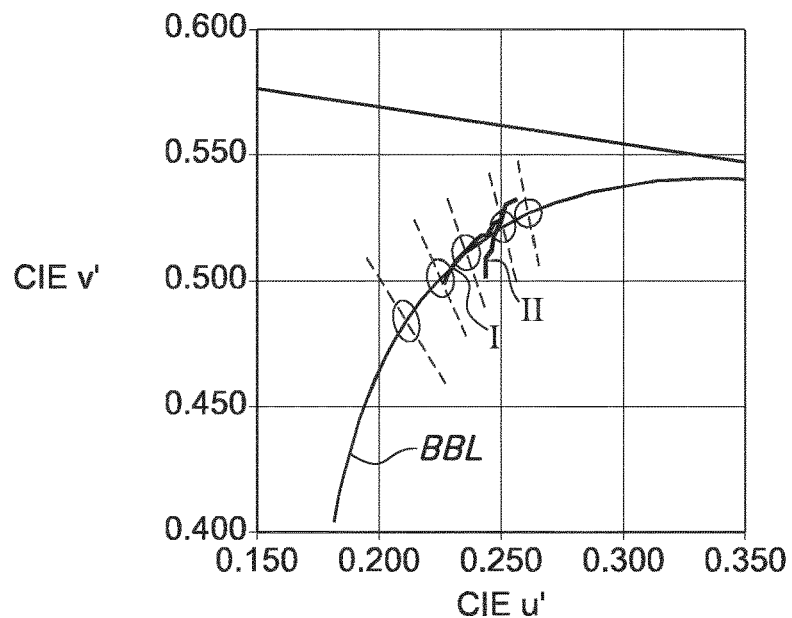
FIGS. 4a-4b show some data.

The performance when adding phosphor to the thermo-responsive material was evaluated, see FIG. 4a. A layer of 100 μm thickness containing a red phosphor component and scattering $TiO_2$ particles is added on top of a mid-power phosphor-converted warm-white LED. The degree of scattering is increased by increasing the scattering particle density. The corresponding CCTs are ranging from 3000K to 4000K. The color points follow the black-body line relatively closely. Hence, the performance of a thermo-responsive material without phosphor is improved by adding red phosphor. The line indicated with I shows the estimated coordinates of the color point when the scattering varies from strong to weak. The corresponding CCTs are ranging from 3000K to 4000K. The line indicated with I relates to the embodiment of FIG. 2a; the line indicated with II relates to the embodiment of FIG. 2d. In these preliminary results, the variant according to I follows the BBL best. However, with some optimization, the variant II may also follow the BBL well. Further, the invention is not limited to embodiments wherein the light device light follows the BBL when increasing or decreasing the electrical power to the lighting device.

Figure 4B:
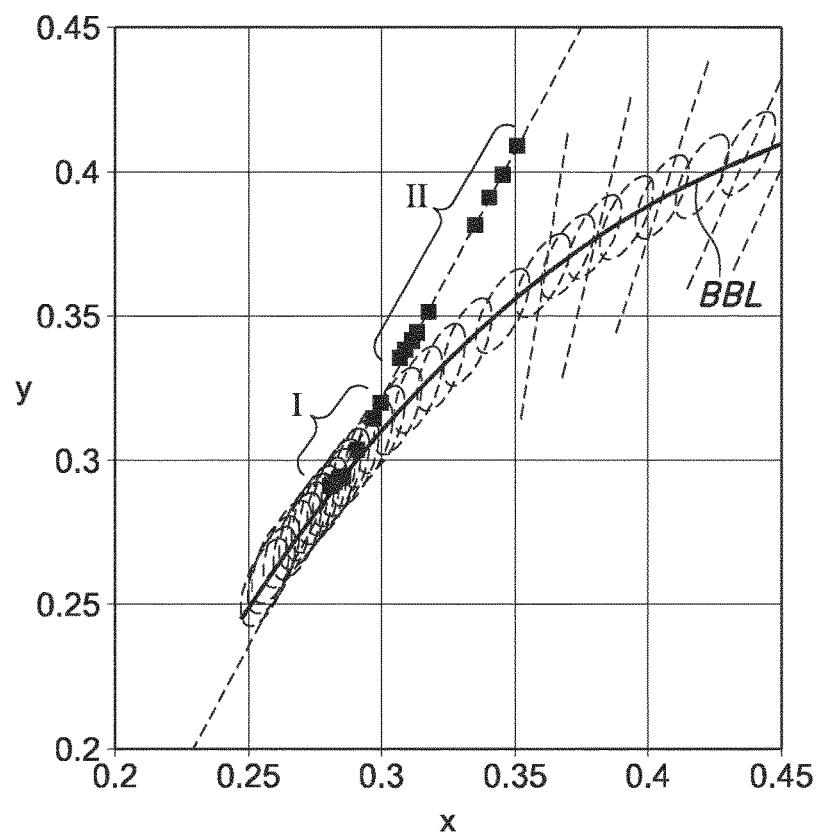

Further experimental proof of the embodiments of FIG. 4a is given in FIG. 4b. In these experiments empty cups with a blue LED chip were filled with a mixture of thermo-responsive scattering liquid crystalline material and a yellow phosphor. This figure shows the measured color points of LED cups filled with a mixture of thermo-responsive LC and yellow phosphor. Dots indicated with reference II; 4 wt. % phosphor, with dome. Dots indicated with reference I: 4 wt. %, without dome. When the current through the LED was varied between 10 mA and 80 mA, the color temperature was measured to change from 5000 K to 6800 K in one case and from 7300 K to 9800 K in another case.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting. The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising a light source configured to generate light source light and a light converter element, wherein the light converter element comprises a light transmissive matrix, wherein the light transmissive matrix comprises:
   (i) a first luminescent material configured to convert at least part of the light source light into a first luminescent material light; and
   (ii) a thermo-responsive liquid crystalline compound;
   wherein the first luminescent material is formed as a plurality of regions embedded in the thermo-responsive liquid crystalline compound,
   wherein the light transmissive matrix is configured to be in thermal contact with the light source,
   wherein the lighting device is further configured to provide lighting device light comprising said light source, and said first luminescent material light, and
   wherein said light converter element is arranged for changing one or more of the color and color temperature of the lighting device light with the electrical power provided to the light source.

2. The lighting device according to any claim 1, wherein the light source comprises a blue LED with an LED die, and wherein the light transmissive matrix is configured without physical contact with said LED die.

3. The lighting device according to claim 1, wherein the lighting device comprises a support, and wherein the light transmissive matrix is configured as coating on said support.

4. The lighting device according to claim 1, wherein the thermo-responsive liquid crystalline compound comprises one or more groups selected from the group consisting of:

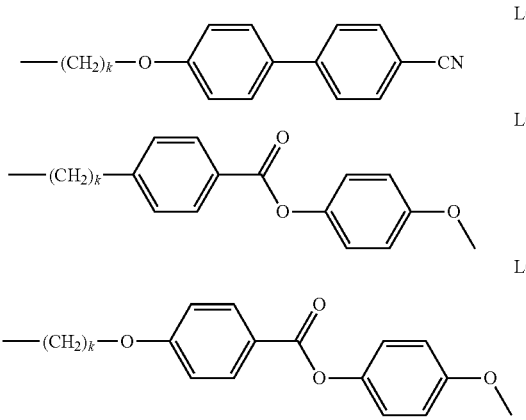

with k in the range of 4-20.

5. The lighting device according to claim 1, wherein the light transmissive matrix comprises a silicone and wherein the thermo-responsive liquid crystalline compound comprises a liquid crystal group functionalized silicone.

6. The lighting device according to claim 1, wherein the light transmissive matrix has at a maximum operation power of the lighting device a temperature of the matrix $T_{max}$, and wherein the thermo-responsive liquid crystalline compound has a transition temperature selected from the range of 15-85% of $T_{max}$.

7. The lighting device according to claim 1, wherein the light transmissive matrix comprises said first luminescent material and a second luminescent material, wherein said second luminescent material is configured to convert at least part one or more of the light source light and optionally the first luminescent material light into second luminescent material light, wherein the first luminescent material light has a first dominant wavelength different from a second dominant wavelength of the second luminescent material light.

8. The lighting device according to claim 7, wherein the first luminescent material is configured to convert at least part of the second luminescent material light into said first luminescent material light.

9. The lighting device according to claim 7, wherein the second luminescent material light has a second dominant wavelength in the green or yellow part of the visible spectrum, and wherein the first luminescent material light has a first dominant wavelength in the red part of the visible spectrum.

10. The lighting device according to claim 7, wherein the lighting device is configured to provide white lighting device light, and wherein the color temperature of the lighting device light is configured to increase with increasing electrical power and decrease with decreasing electrical power over at least part of an electrical power range.

11. The lighting device according to claim 1, comprising a first light transmissive matrix and a second light transmissive matrix, wherein one of the light transmissive matrices comprises said first luminescent material and said thermo-responsive liquid crystalline compound, and wherein the other of the light transmissive matrices comprises a second luminescent material, wherein the first luminescent material light has a first dominant wavelength different from a second dominant wavelength of the second luminescent material light.

12. The lighting device according to claim 11, wherein the first light transmissive matrix is configured downstream of said second light transmissive matrix, and wherein said first light transmissive matrix comprises said thermo-responsive liquid crystalline compound.

13. The lighting device according to claim 12, wherein the light source comprises a blue LED with an LED die, wherein the second light transmissive matrix is configured in physical contact with the LED die, and wherein the first light transmissive matrix is in physical contact with the second light transmissive matrix.

14. A method for customizing a lighting device configured to generate white lighting device light, wherein the lighting device comprises a light emitting surface, the method comprising:
   providing a coating to said light emitting surface, wherein the coating comprises a light converter element, wherein the light converter element comprises a light transmissive matrix comprising a first luminescent material configured to convert at least part of the lighting device light into first luminescent material light, and a thermo-responsive liquid crystalline compound;

embedding of plurality of regions of said first luminescent material light into the thermo-responsive liquid crystalline compound, wherein the coating is transmissive for at least part of said lighting device light, and wherein the lighting device light downstream from said coating further comprises at least part of said first luminescent material light.

15. A lighting device comprising:

a light source configured to generate light source light; and a light transmissive matrix positioned downstream from the light source, wherein the light transmissive matrix comprises a first luminescent material formed as a plurality of regions embedded in a thermo-responsive liquid crystalline compound;

wherein the first luminescent material is configured to convert at least a portion of the light source light into a first luminescent material light; and wherein the lighting device is configured to generate an output that substantially follows the black body line depending on the amount of power supplied to the light source.

16. The lighting device according to claim 15, wherein the output comprises the light source light and the first luminescent material light.

17. The lighting device according to claim 15, wherein the light source is an LED formed within a second luminescent material.

18. The lighting device according to claim 17, wherein the second luminescent material is in physical contact with the light transmissive matrix.

19. The lighting device according to claim 15, wherein the black body line is substantially followed by increasing the color temperature of the lighting device light when increasing electrical power to the lighting device and decreasing the color temperature when decreasing electrical power to the lighting device.

20. The lighting device according to claim 15, wherein the light transmissive matrix comprises a silicone and wherein the thermo-responsive liquid crystalline compound comprises a liquid crystal group functionalized silicone.

\* \* \* \* \*